United States Patent [19]
Kim et al.

[11] Patent Number: 6,125,064
[45] Date of Patent: Sep. 26, 2000

[54] CAS LATENCY CONTROL CIRCUIT

[75] Inventors: Dong Kyeun Kim; Sung Hoon Kim, both of Chungcheongbuk-do, Rep. of Korea

[73] Assignee: Hyundai Micro Electronics Co., Ltd., Cheongju-si, Rep. of Korea

[21] Appl. No.: 09/374,765

[22] Filed: Aug. 16, 1999

[30] Foreign Application Priority Data

Nov. 13, 1998 [KR] Rep. of Korea ............ 98-48677

[51] Int. Cl.[7] .................................................. G11C 7/00
[52] U.S. Cl. ................. 365/193; 365/189.05; 365/194
[58] Field of Search .................................... 365/193, 194, 365/189.05, 189.08, 233

[56] References Cited

U.S. PATENT DOCUMENTS

| | | | |
|---|---|---|---|
| 5,402,388 | 3/1995 | Wojciki et al. | 365/233 |
| 5,511,033 | 4/1996 | Jung | 365/222 |
| 5,559,752 | 9/1996 | Stephens, Jr. et al. | 365/233 |
| 5,764,584 | 6/1998 | Fukiage et al. | 365/230.03 |
| 5,799,053 | 8/1998 | Park | 377/26 |
| 5,812,489 | 9/1998 | Matsui | 365/233 |
| 5,815,462 | 9/1998 | Konishi et al. | 365/233 |
| 5,835,444 | 11/1998 | Kim et al. | 365/233 |
| 5,835,790 | 11/1998 | Nagai et al. | 395/881 |
| 5,940,330 | 8/1999 | Kim | 365/189.05 |
| 6,043,719 | 3/2000 | Lin et al. | 331/57 |
| 6,044,037 | 3/1999 | Kawaguchi | 365/233.5 |

*Primary Examiner*—Richard Elms
*Assistant Examiner*—Hien Nguyen
*Attorney, Agent, or Firm*—Fleshner & Kim, LLP

[57] ABSTRACT

A CAS latency control circuit for a SDRAM is provided for improving operation speeds of first and second CAS latencies. The circuit includes a controlling circuit unit for receiving a clock signal and providing first, second, third, and fourth control signals, a first latch for either passing or latching input data depending on the state of the first control signal, a second latch for either passing or latching the data from the first latching means depending on the state of the second control signal, a data pass selecting unit for forwarding either the data directly from the input or the data from the second latch depending on the state of the fourth control signal, and a third latch for either passing the data from the data pass selecting unit to the data output buffer or latching the data from the data pass selecting means depending on the state of the third control signal.

27 Claims, 8 Drawing Sheets

CAS LATENCY CONTROL CIRCUIT

BACKGROUND OF THE INVENTION

1. Field of the Invention

The present invention relates to a memory device, and more particularly, a Column Address Strobe (CAS) for a memory device.

2. Background of the Related Art

In general, DRAMs are a combination of capacitors and transistors, and are widely used as highly integrated semiconductor memories. However, because the operation of a DRAM is controlled by delaying command signals (RASB, CASB, and the like) and read of its data according to Y-address signal, the DRAM has the disadvantage that data reading time is long and slow. Consequently, recently developed Synchronous DRAMs (SDRAMs) have increased read and write speeds.

A related art CAS latency circuit for a SDRAM will be described with reference to the attached drawings. FIG. 1 illustrates a related art CAS latency control circuit for a SDRAM, FIG. 2 illustrates a system of the latching unit in FIG. 1, and FIG. 3 illustrates a system of the control inverter in FIG. 2.

Referring to FIG. 1, the related art CAS latency control circuit for a SDRAM is provided with three latches 2, 3, and 4, and a controlling circuit unit 1 for controlling the three latches 2, 3, and 4. Thus, controlling circuit unit 1 receives a clock signal QCLK for forwarding data, and provides control signals con1, con2, and con3 for controlling respective latches 2, 3, and 4.

First latch 2 either forwards or latches input data depending on the control signal con3 from the controlling circuit 1. Second latch 3 either forwards or latches the data from the first latch 2 according to the control signal con2 from the controlling circuit unit 1. Third latch 4 either forwards the data from the second latch 3 to an output buffer or latches the data from the second latch 3 according to the control signal con1 from the controlling circuit unit 1.

Referring to FIG. 2, each of the latches 2, 3, and 4 is provided with a first inverter 6 which inverts a control signal con3, con2, con1 from the controlling circuit unit 1. A first control inverter 5 passes data D when the control signal con1, con2, or con3 is "low" in response to the control signal con3, con2, or con1 and the signal from the first inverter 6. This is in the open condition of the latch. A second inverter 8 inverts a signal from the first control inverter 5, and a second control inverter 7 latches a data signal from the second inverter 8 when the control signal con1, con2, or con3 is "high" in response to the control signal con3, con2, or con1 and the signal from the first inverter 6.

Referring to FIG. 3, the control inverter 5 or 7 in each of the latches is provided with first and second PMOS transistors 9 and 10, and first and second NMOS transistors 11 and 12 between a constant supply voltage terminal and a ground voltage terminal. The second PMOS transistor 10 and the first NMOS transistor 11 receive a data signal $D_{in}$ at gates thereof, and the first PMOS 9 receives the control signal con3, con2, or con1 from the controlling circuit unit 1 or a signal from the first inverter 6 at a gate thereof. The second NMOS transistor 12 receives the control signal con3, con2, or con1 from the controlling circuit unit 1 or a signal from the first inverter 6 at a gate thereof, and an output terminal 13 is provided at a node of the second PMOS transistor 10 and the first NMOS transistor 11.

FIG. 4 illustrates a first timing diagram of the related art CAS latency control circuit operation, FIG. 5 illustrates a second timing diagram of the related art CAS latency control circuit operation, FIG. 6 illustrates a third timing diagram of the related art CAS latency control circuit operation, and FIG. 7 illustrates a fourth timing diagram of the related art CAS latency control circuit operation.

Referring to FIG. 4, the controlling circuit unit 1 provides control signals con1, con2, and con3 all at "low" at a first rising edge of a clock signal QCLK, so that all the latches 2, 3, and 4 do not latch data, but instead directly bypass the data. Therefore, the output data Dout is provided at a second rising edge of the clock signal QCLK.

Referring to FIG. 5, the controlling circuit unit 1 provides a control signal con1 to be applied to the third latch 4 at "high" and control signals con2 and con3 to be applied to the first and second latches 2 and 3 respectively at "low" at a first rising edge of a clock signal QCLK, so that the first and second latches do not latch the data. Instead, the data is passed directly to the third latch, which receives the data. Next, the controlling circuit unit 1 controls the control signal con1 to transition from "high" to "low" at a second rising edge of the clock signal, so that the data passes through the third latch 4 and proceeds toward the data output buffer. The controlling circuit unit 1 then transitions the control signal con1 from "low" to "high" again before a third rising edge of the clock signal, so that the data is latched at the third latch.

Referring to FIG. 6, the controlling circuit unit 1 holds the control signal con3 low and control signals con1 and con2 high in synchronization with the clock signal QCLK. It then transitions the control signal con1 from high to low after a second rising edge of the clock signal QCLK, and after a prescribed time period, from low to high again. The controlling circuit unit 1 causes the control signal con2 to transition from high to low when the control signal con1 transitions from low to high, and then from low to high at a third rising edge of the clock signal. Accordingly, the control signals con1 and con2 repeat the aforementioned process in a fourth rising edge of the clock signal. As the control signal is held low, the data passes through the first latch 2 to the second latch 3, and passes through the second latch 3 to the third latch 4 when the control signal con2 transitions to low.

In this instance, as the control signal con2 transitions to high again, the second latch 3 latches and holds the data provided to the third latch 4 until the control signal con2 is transited to low, again. And, when the control signal con1 is transited to low in a second cycle, the third latch 4 forwards the data toward the data output buffer, and when the control signal con1 is transited to high again, latches the data until the control signal con1 is transited to low and holds the data until the next cycle.

Referring to FIG. 7, the controlling circuit unit 1 maintains all of the control signals con1, con2, and con3 at a high level until a second rising edge of the external clock signal QCLK, when the control signals con1, con2, and con3 are transited to low in sequence. Therefore, when a pertinent signal transitions to low, the first latch 2 provides the latched data to the second latch 3, the second latch 3 provides to the third latch 4, and the third latch 4 provides to the data output buffer. Alternatively, when a pertinent control signal transitions from low to high, the data is latched. Thus, as data is provided depending on a user's selection of a mode of the first to fourth CAS latencies, the SDRAM operates faster than a general DRAM.

However, the related art CAS latency control circuit for a SRAM has various problems. For example, passing data through all the series connected latches, regardless of the cases of CAS latency, results in an unnecessary data transmission delay. Particularly, as the data passes directly through the first, second, and third latches without being latched by any of the latches, as in the case of the first CAS latency, e.g., FIG. 4, or latched only by the third latch as in the case of second CAS latency, e.g., FIG. 5, data transmission delay becomes a problem.

The above references are incorporated by reference herein where appropriate for appropriate teachings of additional or alternative details, features and/or technical background.

SUMMARY OF THE INVENTION

The present invention is substantially obviate one or more of the problems due to limitations and disadvantages of the related art.

An object of the present invention is to prevent the passing of data through unnecessary latches, thus preventing unnecessary data delay.

Another object of the present invention is to improve the operational speed.

To achieve these at least these objects in whole or in parts, and in accordance with the purpose of the present invention, as embodied and broadly described, the CAS latency control circuit includes a controlling circuit unit for receiving a clock signal for data forwarding and providing a first, a second, a third, and a fourth control signals, a first latching means either for passing or latching an inside data depending on the first control signal from the control circuit unit, a second latching means either for passing or latching the data from the first latching means depending on the second control signal from the control circuit unit, a data pass selecting unit for forwarding either the inside data directly or the data from the second latching means depending on the fourth control signal from the control circuit unit, and a third latching means either for passing the data from the data pass selecting unit to the data output buffer or latching the data from the data pass selecting means depending on the third control signal from the control circuit unit.

In other embodiment of the present invention, there is provided a CAS latency control circuit including a controlling circuit unit for receiving a clock signal for data forwarding and providing a first, a second, a third, and a fourth control signals, a first latching means either for passing or latching a data from inside in response to the first control signal from the controlling circuit unit, a second latching means either for passing or latching the data from the first latching means in response to the second control signal from the controlling circuit unit, a third latching means either for passing or latching the data from the second latching means in response to the third control signal from the controlling circuit unit, a fourth latching means either for passing or latching the data from inside in response to the third control signal from the controlling circuit unit, and a data pass selecting unit for providing the data either from the third latching means or the fourth latching means to the data output buffer in response to the fourth control signal from the controlling circuit unit.

To further achieve at least the above-described objects in whole or in parts, there is provided a data pass selecting unit for a column address strobe latency control circuit according to the present invention that includes first and second transmission gates, each having a first terminal, an inverted terminal, an input terminal, and an output terminal, and an inverter having an input terminal and an output terminal, wherein the first terminal of the first transmission gate and the inverted terminal of the second transmission gate are coupled to the output terminal of the inverter, the inverted terminal of the first transmission gate, the first terminal of the second transmission gate, and the input terminal of the inverter are coupled to receive a control signal, the input terminal of the first transmission gate is coupled to receive a first input signal, the input terminal of the second transmission gate is coupled to receive a second input signal, and the output terminal of the first transmission gate is coupled to the output terminal of the second transmission gate.

To further achieve at least the above-described objects in whole or in parts, there is provided a column address strobe latency control circuit according to the present invention that includes a first data latch responsive to a first control signal, a data pass selector responsive to a selector control signal, and a controller, wherein the controller receives a clock signal and generates the first control signal and the selector control signal, the first data latch and the data pass selector being coupled to receive a first input signal, and the data pass selector being coupled to receive a signal from the first data latch and outputting an output signal, wherein the output signal is one of (1) the first input signal forwarded through the first data latch and the data pass selector and (2) the first input signal forwarded through the data pass selector and bypassing the first data latch, in response to the first control signal and the selector control signal.

To further achieve at least the above-described objects in whole or in parts, there is provided a column address strobe latency control circuit according to the present invention that includes first and second data latches, each responsive to a first control signal, a data pass selector responsive to a selector control signal, and a controller, wherein the controller receives a clock signal and generates the first control signal and the selector control signal, the first and second data latches are coupled to receive a first input signal, and the data pass selector being coupled to receive a signal from each of said first and second data latches and output an output signal, wherein the output signal is one of (1) the first input signal forwarded through the first data latch and the data pass selector and bypassing the second data latch, and (2) the first input signal forwarded through the second data latch and the data pass selector, in response to the first control signal and the selector control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 8:
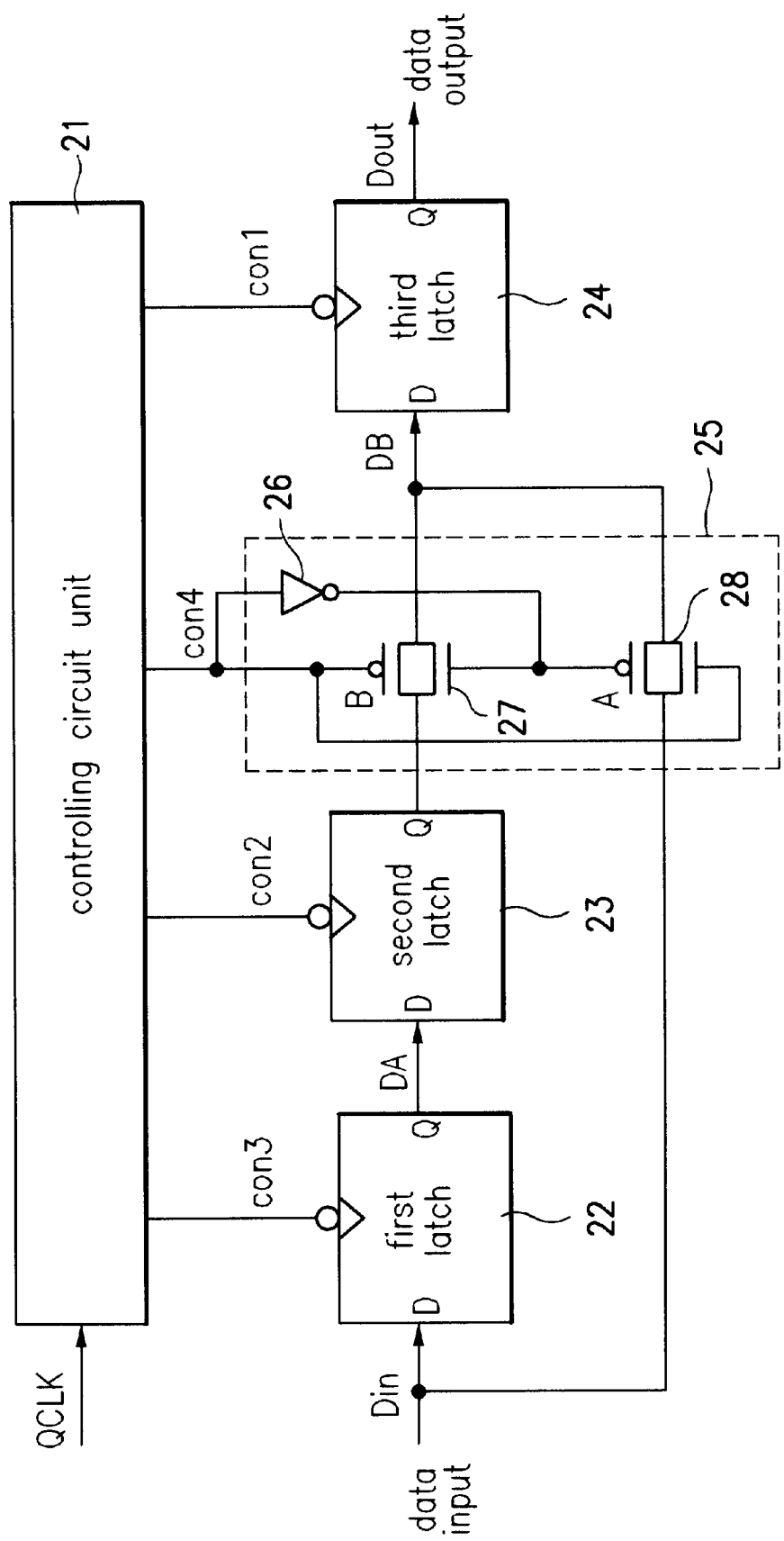
FIG. 8 is a drawing illustrating a system of a CAS latency control circuit in accordance with a first embodiment of the present invention.

Referring to FIG. 8, a CAS latency control circuit according to a first preferred embodiment of the present invention includes a first latch 22, a second latch 23, and a third latch 24 connected in series. The circuit preferably also includes a data pass selecting unit 25 for selecting a data pass between the second latch 23 and the third latch 24, and a controlling circuit unit 21 for controlling the first, second, and third latches 22, 23, 24 and the data pass selecting unit 25. Thus, controlling circuit unit 21 receives a clock signal QCLK for data forwarding, and provides control signals con1, con2, con3, and con4 for selecting latches 22, 23, and 24 and the data pass selecting unit 25, respectively.

The first latch 22 either passes or latches input data $D_{in}$ depending on the state of control signal con3 from the control circuit unit 21. The second latch 23 either passes or latches the data from the first latch 22, depending on the state of control signal con2 from the control circuit unit 21. The data pass selecting unit 25 either applies the input data $D_{in}$ to the third latch 24 directly, or provides the data from the second latch 23 to the third latch 24 depending on the state of control signal con4 from the control circuit unit 21. The third latch 24 either passes the data from the data pass selecting unit 25 to the data output buffer, or latches the data from the data pass selecting unit 25 depending on the state of control signal con1 from the control circuit unit 21. When a latch passes the data, it is said to be open.

The data pass selecting unit 25 according to a first preferred embodiment of the present invention includes an inverter 26 which inverts the control signal con4 from the controlling circuit unit 21, and a transmission gate 27 which transmits an output of the second latch 23 to the third latch 24 in response to the control signal con4 from the controlling circuit unit 21 and a signal from the inverter 26. The data pass selecting unit 25 preferably also includes a second transmission gate 28 which directly transmits the data to the third latch 24 in response to the control signal con4 from the controlling circuit unit 21 and the signal from the inverter 26.

Figure 9:
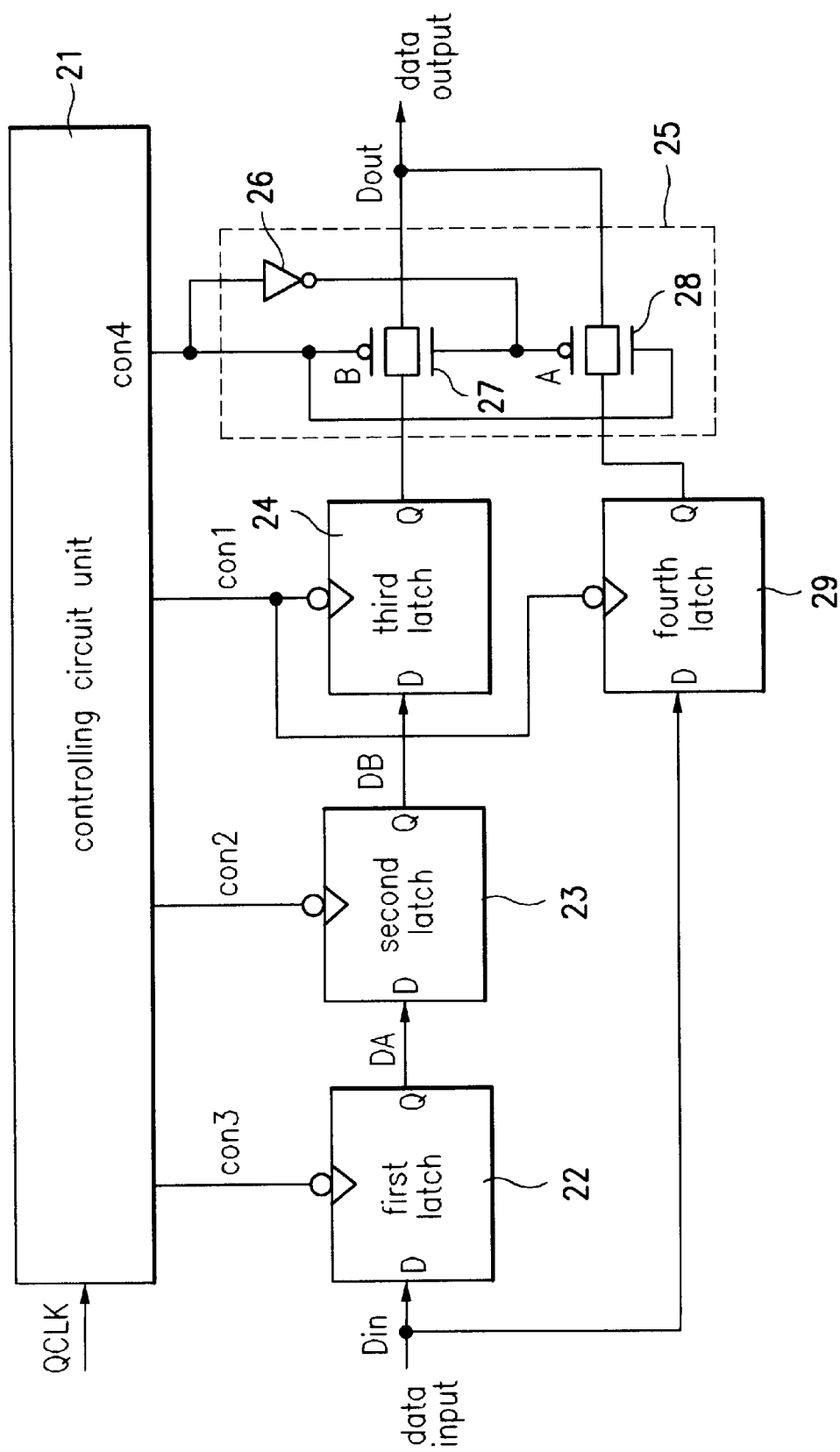
FIG. 9 is a drawing illustrating a system of a CAS latency control circuit in accordance with a second embodiment of the present invention.

Referring to FIG. 9, a CAS latency control circuit according to a second preferred embodiment of the present invention includes a controlling circuit unit 21 which receives a clock signal QCLK in charge of data forwarding, and provides control signals con1, con2, con3, and con4. The circuit also preferably includes a first latch 22 which either passes or latches input data $D_{in}$ in response to the state of control signal con3 from the controlling circuit unit 21, a second latch 23 which either passes or latches the data from the first latch 22 in response to the state of the control signal con2 from the controlling circuit unit 21, and a third latch 24 which either passes or latches the data from the second latch 23 in response to the state of the control signal con1 from the controlling circuit unit 21. There is also preferably provided a fourth latch 29 which either passes or latches the input data $D_{in}$ in response to the state of the control signal con1 from the controlling circuit unit 21, and a data pass selecting unit 25 which provides the data either from the third latch 24 or the fourth latch 29 to the data output buffer in response to the control signal con4 from the controlling circuit unit 21.

The data pass selecting unit 25 according to one embodiment includes an inverter 26 which inverts the control signal con4 from the controlling circuit unit 21, a first transmission gate 27 which transmits an output of the third latch 24 to the data output buffer in response to the control signal con4 from the controlling circuit unit 21 and a signal from the inverter 26, and a second transmission gate 28 which transmits data from the fourth latch 29 to the data output buffer in response to the control signal con4 from the controlling circuit unit 21 and a signal from the inverter 26.

The operations of the aforementioned CAS latency control circuit according to the first preferred embodiment of the present invention will be described. First, in first and second CAS latency operations, the controlling circuit unit 21 provides the control signal con4 at a high state, and in third and fourth CAS latency operations, the controlling circuit unit 21 provides the control signal con4 at a low state. Therefore, in the first and second CAS latency operations, the first transmission gate 27 in the data pass selecting unit 25 is turned off and the second transmission gate 28 is turn on. Thus, the input data $D_{in}$ does not pass through the first and second latches 22 and 23, but instead is provided to the third latch 24 directly. Under this state, in the case of the first CAS latency operation, the third latch 24 passes the data to the data output buffer because the control signal con1 is at a low state.

Figure 5:
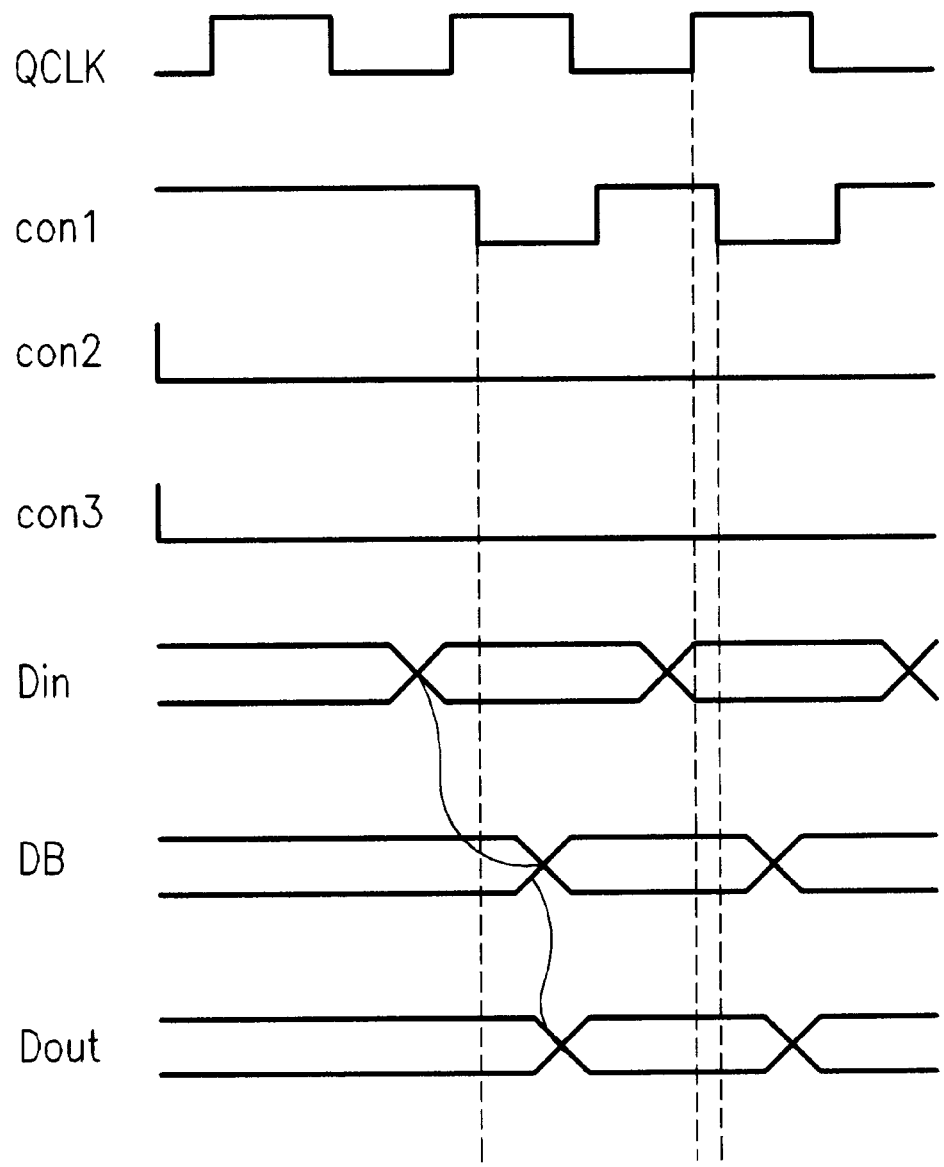
FIG. 5 is a drawing illustrating an operation timing diagram of a related art second CAS latency.

In the case of the second CAS latency operation, the data is presented one pulse later than in the first CAS latency because the control signal con1 transitions to low after a second rising edge of the clock signal QCLK, as shown in FIG. 5. On the other hand, in the third and fourth CAS latency operations, the first transmission gate 27 of the data pass selecting unit 25 is turned on and the second transmission gate 28 is turned off. Accordingly, input data $D_{in}$ is passed through the first, second, and third latches 22, 23, and 24.

Figure 1:
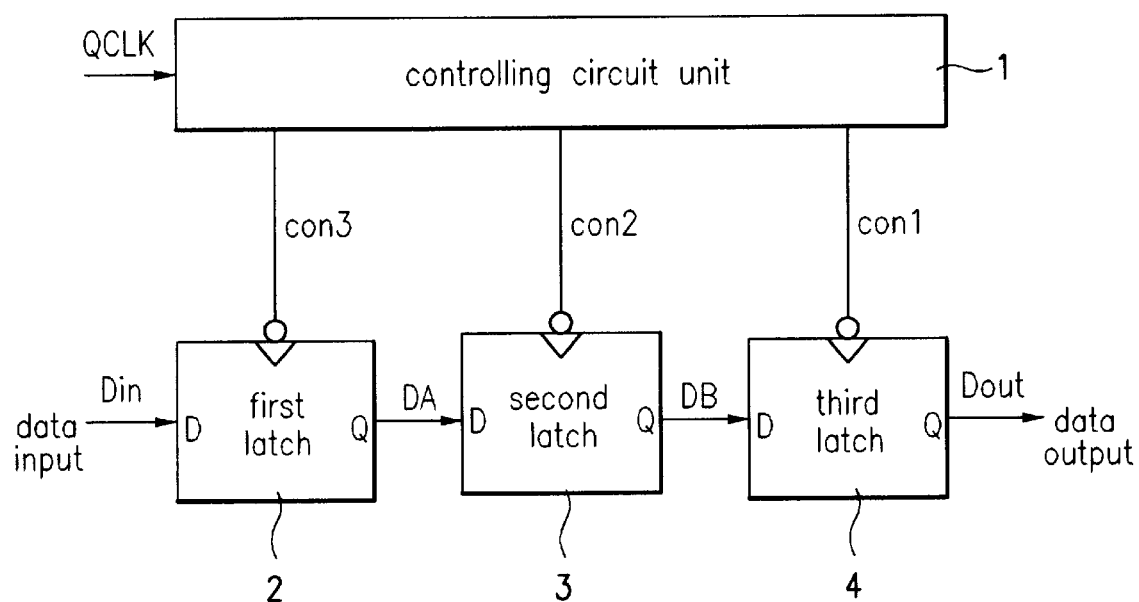
FIG. 1 is a drawing illustrating a related art CAS latency control circuit for a SDRAM.
Figure 2:
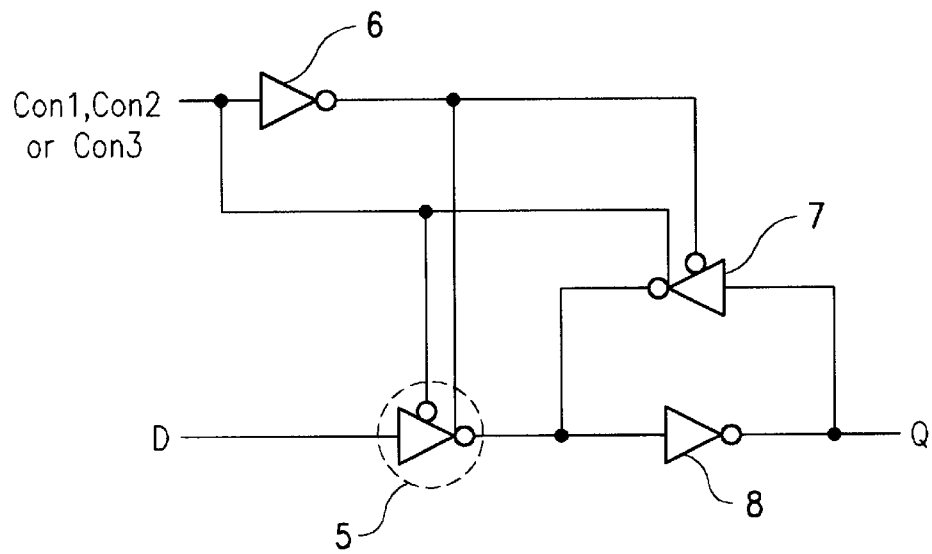
FIG. 2 is a drawing illustrating a system of the latching unit in FIG. 1.
Figure 3:
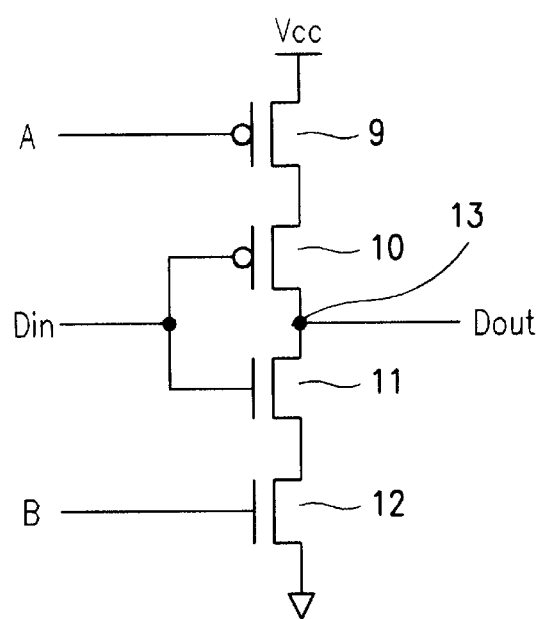
FIG. 3 is a drawing illustrating a system of the control inverter in FIG. 2.
Figure 4:
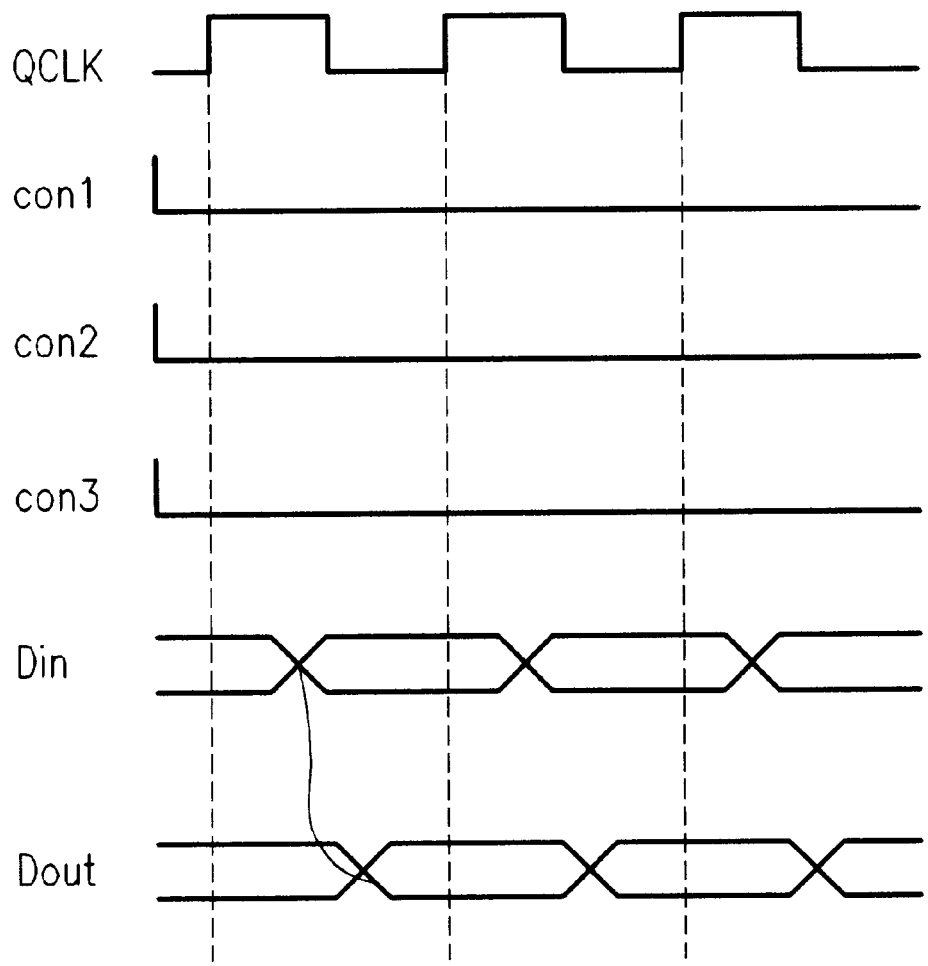
FIG. 4 is a drawing illustrating an operation timing diagram of a related art first CAS latency.

The operations of the aforementioned CAS latency control circuit according to the second preferred embodiment of the present invention will next be described. In the second embodiment of a CAS latency control circuit, the controlling circuit unit 21 provides the control signal con4 at a high state in the first and second CAS latency operations, and at a low state in the third and fourth CAS latency operations. Accordingly, since the first transmission gate 27 is turned off and the second transmission gate 28 is turned on in the first and second CAS latency operations, the input data $D_{in}$ does not pass through the first, second, and third latches 22, 23, 24, but instead passes through the fourth latch 29 only. In this instance, each of the control signals con1, con2, and con3 is identical to those of the related art, as shown in FIGS. 4 and 5.

Figure 6:
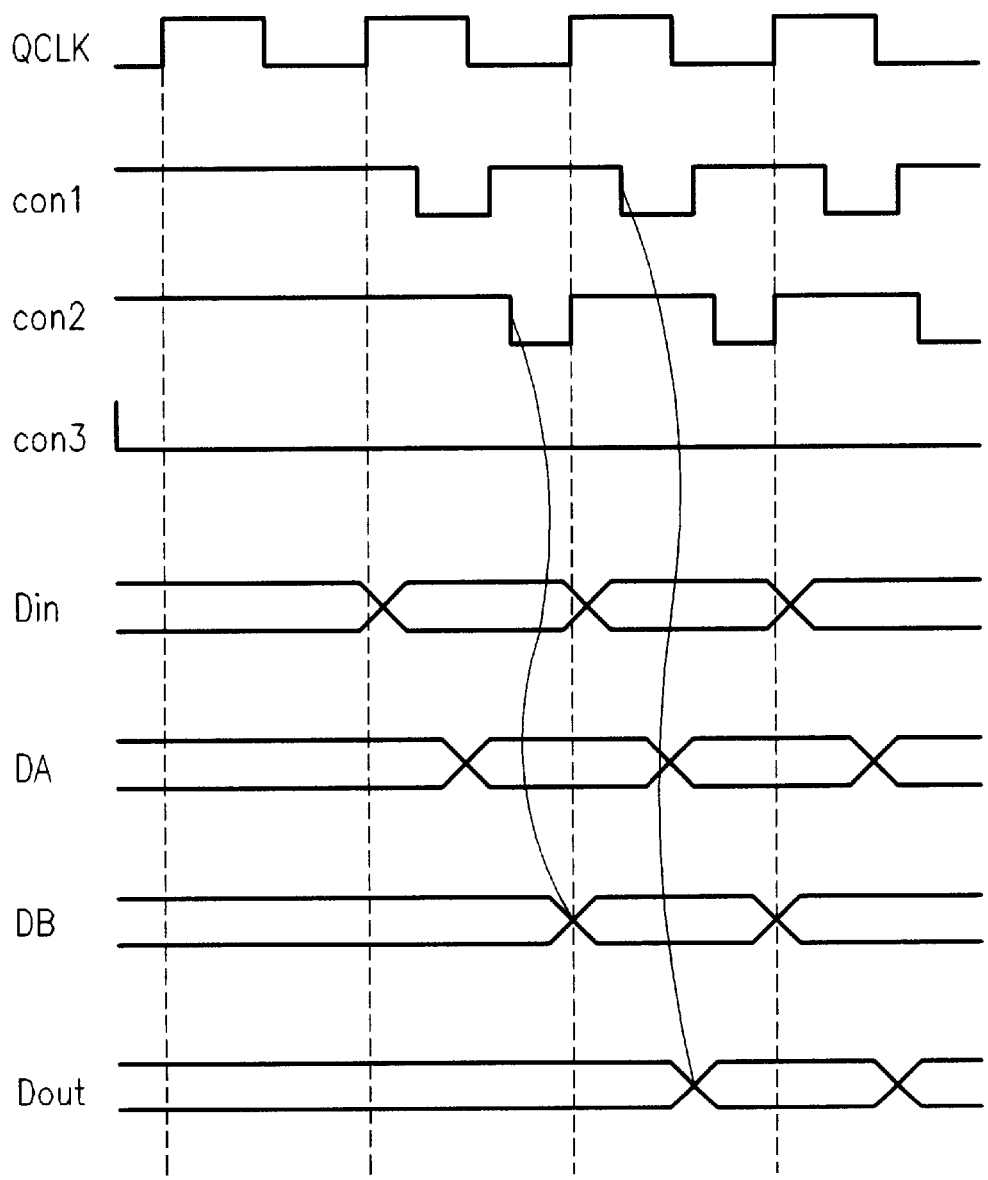
FIG. 6 is a drawing illustrating an operation timing diagram of a related art third CAS latency.
Figure 7:
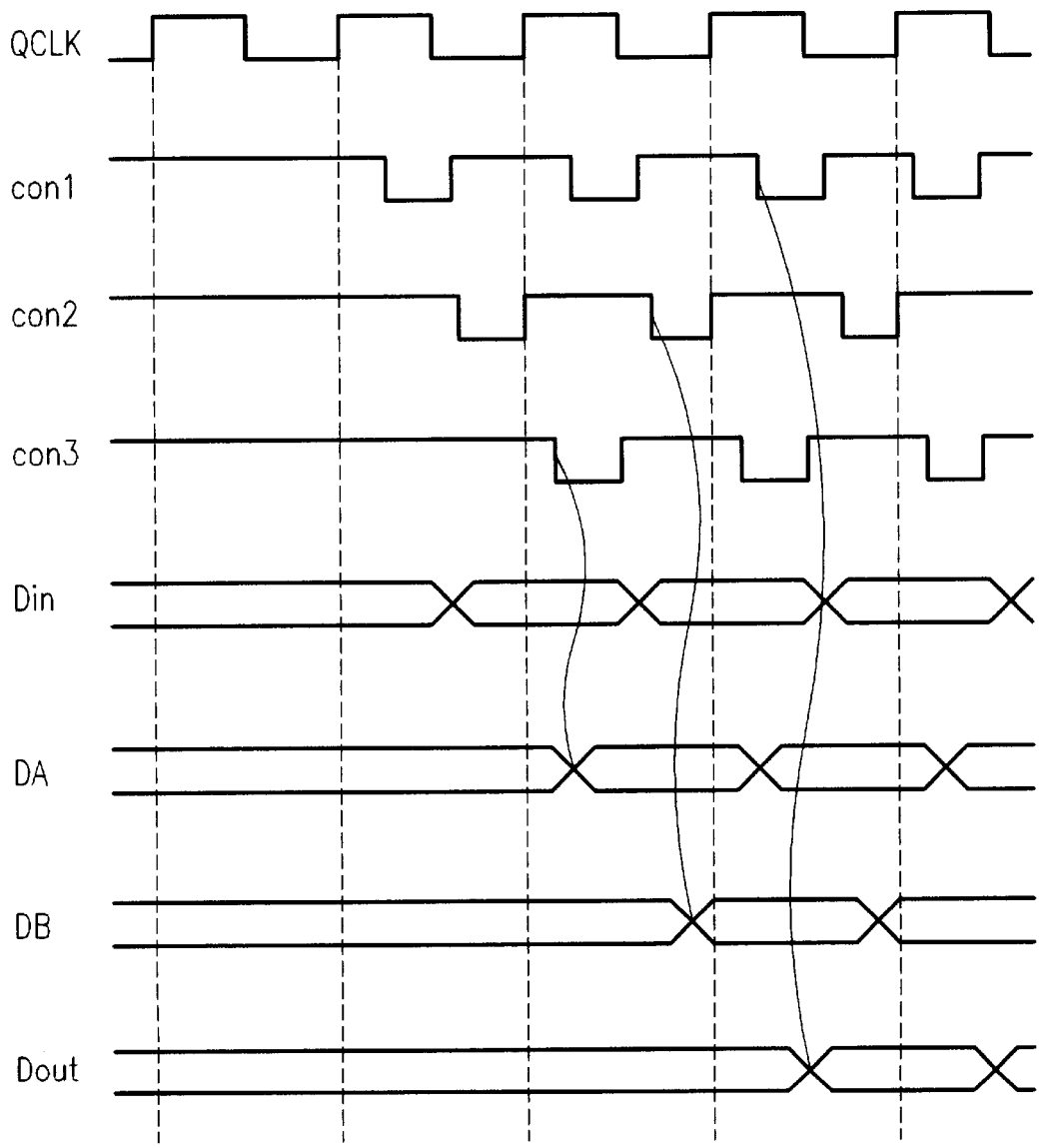
FIG. 7 is a drawing illustrating an operation timing diagram of a related art first CAS latency.

In the third and fourth CAS latency operations, since the first transmission gate 27 is turned on and the second transmission gate 28 is turned off, the input data $D_{in}$ passes through the first, second, and third latching means 22, 23, 24. Each of the control signals con1, con2, and con3 is identical to those of the related art, as shown in FIGS. 6 and 7.

The embodiments of the CAS latency control circuit of the present invention have at least the following advantages. The parallel data pass depending on CAS latencies can prevent passing through unnecessary latches thus reducing data delay. That is, in the first and second latency operations in the related art, the serial pass of data through the unnecessary first and second latching means caused the data delay. The prevention of data delay allows a faster SDRAM.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A Column Address Strobe (CAS) latency control circuit, comprising:

a controlling circuit unit for receiving a clock signal and providing first, second, third, and fourth control signals;

a first latching means for either passing or latching an input data depending on the state of said first control signal;

a second latching means for either passing or latching data from said first latching means depending on the state of said second control signal;

a data pass selecting means for forwarding either the input data or data from said second latching means depending on the state of said fourth control signal; and a third latching means for either passing data from said data pass selecting unit to a data output buffer or latching the data from said data pass selecting means depending on the state of said third control signal from said controlling circuit unit.

2. The CAS latency control circuit of claim 1, wherein said data pass selecting unit further comprises:

an inverter for inverting said fourth control signal;

a transmission gate for transmission of an output of said second latching means to said third latching means in response to said fourth control signal and a signal from said inverter; and a second transmission gate for transmission of the input data to said third latching means directly in response to said fourth control signal and the signal from said inverter.

3. A Column Address Strobe (CAS) latency control circuit, comprising:

a controlling circuit unit for receiving a clock signal and providing first, second, third, and fourth control signals;

a first latching means for either passing or latching input data in response to said first control signal;

a second latching means for either passing or latching data from said first latching means in response to said second control signal;

a third latching means for either passing or latching data from said second latching means in response to said third control signal;

a fourth latching means for either passing or latching input data in response to said third control signal; and a data pass selecting unit for providing data either from said third latching means or said fourth latching means to a data output buffer in response to said fourth control signal.

4. The CAS latency control circuit of claim 3, wherein said data pass selecting unit further comprises:

an inverter for inverting said fourth control signal;

a first transmission gate for transmission of an output data of said third latching means to the data output buffer in response to said fourth control signal and a signal from said inverter; and a second transmission gate for transmission of data from said fourth latching means to the data output buffer in response to said fourth control signal and the signal from said inverter.

5. A data pass selecting unit for a Column Address Strobe (CAS) latency control circuit, comprising:

first and second transmission gates, each having a first terminal, an inverted terminal, an input terminal, and an output terminal; and an inverter having an input terminal and an output terminal, wherein the first terminal of said first transmission gate and the inverted terminal of said second transmission gate are coupled to the output terminal of said inverter, the inverted terminal of said first transmission gate, the first terminal of said second transmission gate, and the input terminal of said inverter are coupled to receive a control signal, the input terminal of said first transmission gate is coupled to receive a first input signal, the input terminal of said second transmission gate is coupled to receive a second input signal, and the output terminal of said first transmission gate is coupled to the output terminal of said second transmission gate.

6. The data pass selecting unit of claim 5, wherein the control signal controls which one of said first and second transmission gates passes information.

7. The data pass selecting unit of claim 5, wherein said first transmission gate is on and said second transmission gate is off when the control signal is low.

8. The data pass selecting unit of claim 5, wherein the first input signal is generated by applying the second input signal to at least one data latch circuit.

9. A Column Address Strobe (CAS) latency control circuit, comprising:

a first data latch responsive to a first control signal;

a data pass selector responsive to a selector control signal; and a controller, wherein said controller receives a clock signal and generates the first control signal and the selector control signal, said first data latch and said data pass selector being coupled to receive a first input signal, and said data pass selector being coupled to receive a signal from said first data latch and outputting an output signal, wherein the output signal is one of (1) the first input signal forwarded through said first data latch and said data pass selector and (2) the first input signal forwarded through said data pass selector and bypassing said first data latch, in response to the first control signal and the selector control signal.

10. The circuit of claim 9, wherein said data pass selector comprises:

first and second transmission gates having a first terminal, an inverted terminal, an input terminal, and an output terminal; and an inverter having an input terminal and an output terminal, wherein the first terminal of said first transmission gate and the inverted terminal of said second transmission gate are coupled to the output terminal of said inverter, the inverted terminal of said first transmission gate, the first terminal of said second transmission gate, and the input terminal of said inverter are coupled to receive the selector control signal, the input terminal of said first transmission gate is coupled to receive the output signal of said first data latch, the input terminal of said second transmission gate is coupled to receive the first input signal, and the output terminal of said first transmission gate is coupled to the output terminal of said second transmission gate.

11. The circuit of claim 9, wherein said first data latch either passes or latches the first input signal in response to the first control signal.

12. The circuit of claim 9, further comprising a second data latch responsive to a second control signal.

13. The circuit of claim 12, wherein said second data latch either passes or latches the first input signal in response to the second control signal.

14. The circuit of claim 12, wherein said second data latch is connected in series between said first data latch and said data pass selector.

15. The circuit of claim 14, wherein the output signal comprises one of (1) the first input signal forwarded through said first and second data latches and said data pass selector and (2) the first input signal forwarded through said data pass selector and bypassing said first and second data latches, in response to the first and second control signals and the selector control signal.

16. The circuit of claim 14, further comprising a third data latch responsive to a third control signal.

17. The circuit of claim 16, wherein said third data latch is coupled to receive the output signal.

18. The circuit of claim 12, wherein said second data latch receives the output signal.

19. A Column Address Strobe (CAS) latency control circuit, comprising:
    first and second data latches, each responsive to a first control signal;
    a data pass selector responsive to a selector control signal; and
    a controller, wherein said controller receives a clock signal and generates the first control signal and the selector control signal, said first and second data latches are coupled to receive a first input signal, and said data pass selector being coupled to receive a signal from each of said first and second data latches and output an output signal, wherein the output signal is one of (1) the first input signal forwarded through said first data latch and said data pass selector and bypassing said second data latch, and (2) the first input signal forwarded through said second data latch and said data pass selector, in response to the first control signal and the selector control signal.

20. The circuit of claim 19, wherein said data pass selecting unit comprises:
    first and second transmission gates having a first terminal, an inverted terminal, an input terminal, and an output terminal; and
    an inverter having an input terminal and an output terminal, wherein the first terminal of said first transmission gate and the inverted terminal of said second transmission gate are coupled to the output terminal of said inverter, the inverted terminal of said first transmission gate, the first terminal of said second transmission gate, and the input terminal of said inverter are coupled to receive the second control signal, the input terminal of said first transmission gate is coupled to receive the signal from said first data latch, the input terminal of said second transmission gate is coupled to receive the signal from said second data latch, and the output terminal of said first transmission gate is coupled to the output terminal of said second transmission gate.

21. The circuit of claim 19, wherein each of said first and second data latches either passes or latches the first input signal in response to the first control signal.

22. The circuit of claim 19, further comprising a third data latch responsive to a second control signal.

23. The circuit of claim 22, wherein said third data latch either passes or latches the first input signal in response to the second control signal.

24. The circuit of claim 22, wherein said third data latch is connected in series between said first data latch and said data pass selector.

25. The circuit of claim 24, wherein the output signal is one of (1) the first input signal forwarded through said first and third data latch and said data pass selector and bypassing said second data latch, and (2) the first input signal is forwarded through said second data latch and said data pass selector and bypassing said first and third data latches, in response to the first control signal and the selector control signal.

26. The circuit of claim 24, further comprising a fourth data latch responsive to a third control signal.

27. The circuit of claim 26, wherein said fourth data latch is coupled in series between said third data latch and said data pass selector.

* * * * *